United States Patent [19]
Hoffman et al.

[11] Patent Number: 6,144,330
[45] Date of Patent: Nov. 7, 2000

[54] LOW POWER RAMP GENERATOR FOR USE IN SINGLE SLOPE A/D

[75] Inventors: Eric J. Hoffman, Chandler; Lawrence T. Clark, Phoenix, both of Ariz.

[73] Assignee: Intel Corporation, Santa Clara, Calif.

[21] Appl. No.: 09/146,284

[22] Filed: Sep. 3, 1998

[51] Int. Cl.$^7$ .................................................... H03M 1/50
[52] U.S. Cl. ........................ 341/166; 341/155; 327/379
[58] Field of Search .................... 341/169, 170, 341/166, 155; 327/306, 536, 537, 131

[56] References Cited

U.S. PATENT DOCUMENTS

5,539,351  7/1996  Gilsdorf et al. ................... 327/379
5,982,318 11/1999  Yiannoulos ........................ 341/155

*Primary Examiner*—Brian Young
*Assistant Examiner*—John Nguyen
*Attorney, Agent, or Firm*—Blakely, Sokoloff, Taylor & Zafman LLP

[57] ABSTRACT

An apparatus comprising a charge pump configured to receive an input signal and to output incrementally a fixed amount of voltage for every selected edge of the input signal, an analog buffer coupled to said charge pump, the analog buffer feeding back a second voltage to said charge pump, the output of the charge pump linearly increases as a function of the fixed amount of voltage. A low power ramp generator that is created thereby may be used in analog to digital converters which are employed in devices such as imaging systems.

38 Claims, 5 Drawing Sheets

LOW POWER RAMP GENERATOR FOR USE IN SINGLE SLOPE A/D

BACKGROUND OF THE INVENTION

1. Field of the Invention

The present invention generally relates to the field of analog-to-digital (A/D) converters. More specifically, the present invention relates to ramp generators utilized in A/D converters.

2. Description of the Related Art

A/D converters are utilized to represent analog signals in a digital form. A/D converters are typically employed in systems such as microcomputers, imaging systems, and automobile electronic systems. The analog information input to an A/D converter may be, for example, analog photocell charges from an image sensing device or measurements of physical variables such as temperature, force, etc. After an A/D converter converts the analog information to digital, the digital information can be stored in memory units and/or passed to processing circuits such as an image compression module.

Figure 1A:
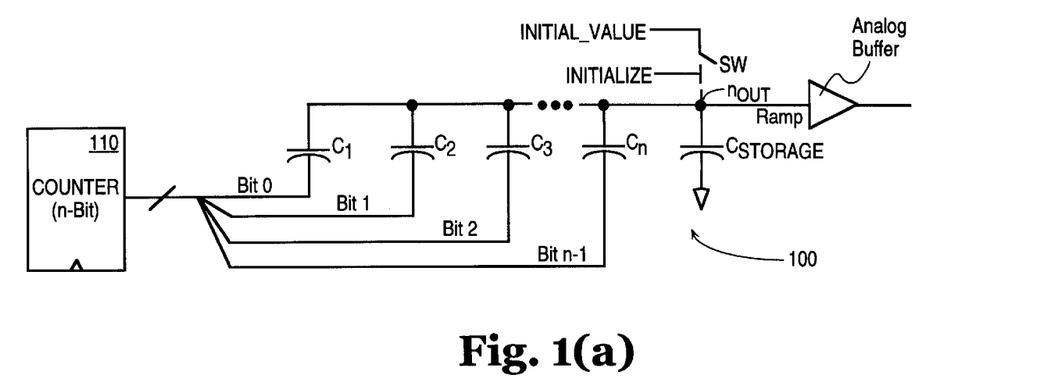

A/D converters typically consist of active and passive devices among one of which is a "ramp generator". Ramp generators generate ramp-like signals that are monotonically increasing with time. FIG. 1($a$) is a diagram of a conventional ramp generator. FIG. 1($a$) shows a ramp generator 100 using a series of binary weighted capacitors, $C_1$, $C_2$, $C_3$ ... $C_n$, whereby $C_2 = 2*C_1$, $C_3 = 4*C_1$, etc. such that $C_n = 2^{(n-1)}*C_1$. Capacitors $C_1$, $C_2$, $C_3$ ... $C_n$ act to provide charge to output node $n_{OUT}$. Output node $n_{OUT}$ or a buffered version of output node $n_{OUT}$ forms the output of ramp generator 100. When the outputs of the n-bit counter transition high its associated capacitor ($C_1$ ... $C_n$) will add charge to node $n_{OUT}$ thus increasing its voltage. Conversely when an output of the counter transitions low it will subtract charge from $n_{OUT}$ thus decreasing its voltage. For an n-bit digital input signal IN from counter 110, the most significant bit n−1 will control a capacitor $C_n$ with a value of $2^{(n-1)}*C_1$ and the least significant bit 0 will control the capacitor $C_1$. In general, a bit k output by counter 110 will control a capacitor $C_{K+1}$ with a value $2^{(n-1)}*C_1$. Ramp generator 100 will ramp its output with each increment of counter 110.

Ramp generator 100 operates as follows. The output of the ramp generator, $V_{RAMP}$ is initialized to the desired starting value provided by the signal INITIAL_VALUE, by asserting an INITIALIZE signal, which closes a switch SW. The voltage across capacitor, $C_1$, $C_2$ ... $C_n$, is initially equal to INITIAL_VALUE since the counter begins at a value (n zeroes) (i.e., 0 volts). When the counter 110 is first incremented from an all-zero initial value, bit 0 will first go high as such charge is added to the output node. The added charge $\Delta Q = C_1*V_{DD}$, where $V_{DD}$ is the voltage level appearing at the output of bit 0 of the counter resulting from the counter bit 0 to 1 transition. At this counter value of 1, all other bits 1 ... n−1 will be zero. When the counter increments again (from 000 ... 01 to 000 ... 10), bit 0 will go low and bit 1 will be high. Thus, the capacitor $C_1$ subtracts charge from node $n_{OUT}=C_1*V_{DD}$. But, since bit 1 is high, the capacitor $C_2$ will add charge $\Delta Q_2=C_2*V_{DD}$, where $V_{DD}$ is the voltage level appearing at bit 1 of the counter as a result of the bit 1 going high. Since $C_2=2*C_1$, $\Delta Q_2=2*C_1*\Delta V=2*\Delta Q_1$. The counter incrementing from 1 to 2 caused an extra $\Delta Q_1$ amount of charge to appear at the output node. As the counter increases with time, either an extra bit will be turned high or some bits turned high and others turned low, so that in effect, charge that was previously contributed "subtracted" or discharged in favor of a greater charge amount.

Figure 1B:
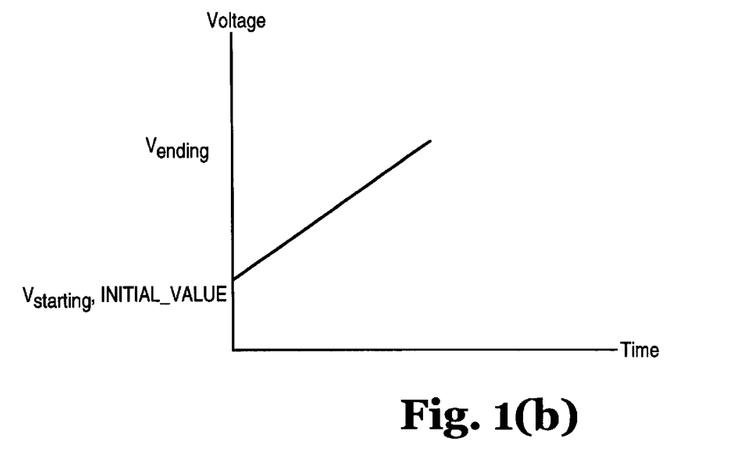

The linear ramp output generated by the ramp generator of FIG. 1($a$) is shown in FIG. 1($b$). The ramps of FIG. 1($b$) is an ideal ramp assuming no fluctuations in the amount of charge added to the output node, but is always a monotone increasing function of time.

The design of the conventional ramp generator shown in connection with FIG. 1($a$) has several drawbacks. One drawback is that since the output of the ramp depends upon capacitors which should have matched values since each capacitor is presumed to be double (binary weighted) its predecessor. Furthermore, the conventional ramp generator occupies a lot of space since it uses a plurality of analog capacitors which in a digital system implies a misfit mixing of analog and digital process technology. Further, an n-bit counter requires n capacitors to generate the ramp, and thus may prohibit implementing large counters. Moreover, from a power perspective, the conventional ramp generator is inefficient and consumes a lot of power. As the ramp generator counts up, it adds charge, but also subtracts charge in some instances. For instance, when counter 110 counts from 1 (000.01) to 2 (000.10), capacitor $C_1$ subtracts charge while capacitor $C_2$ adds charge. The charge and voltage utilized by counter value 1 is useless and discarded at counter value 2. Every time charge is subtracted or dissipated, power is wasted.

Thus, there is a need for a ramp generator that utilizes less power and that can be implemented using fewer, less space-taking and more process efficient components than the ramp generator of the conventional design.

SUMMARY

What is disclosed is an apparatus comprising a charge pump configured to receive an input signal and to output incrementally a fixed amount of voltage for every selected edge of the input signal, an analog buffer coupled to said charge pump, the analog buffer feeding back a second voltage to said charge pump, the output of the charge pump linearly increases as a function of the fixed amount of voltage.

BRIEF DESCRIPTION OF THE DRAWINGS

The objects, features and advantages of the method and apparatus for the present invention will be apparent from the following description in which:

FIG. 1($a$) illustrates a conventional ramp generator design;

FIG. 1($b$) is a graph of the output of an ideal ramp generator;

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, firmware or combinations thereof.

The present invention utilizes a single capacitive element to add a fixed amount of charge to the output node with every edge (leading and/or trailing) of an input signal such as that of a digital counter.

Figure 2:
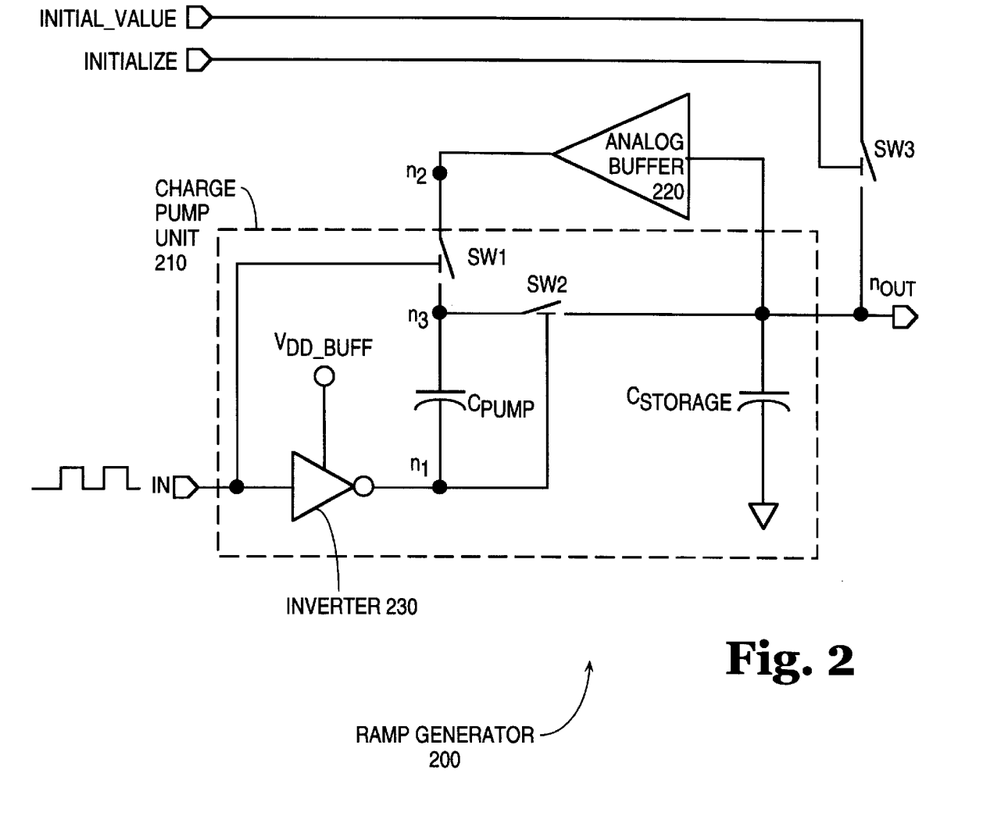
FIG. 2 illustrates a ramp generator in accordance with at least one embodiment of the present invention.

FIG. 2 illustrates a ramp generator in accordance with at least one embodiment of the present invention. Ramp generator 200 may ramp its output on the leading and/or trailing, edges of an input signal IN from a digital counter. According to one embodiment of the present invention, ramp generator 200 will ramp its output on the trailing edge of digital input signal IN which may be the clocking signal of a counter, for instance. Ramp generator 200 includes a charge pump unit 210, an analog buffer 220, and a switch SW3. With every trailing edge of digital input signal IN, charge pump unit 210 adds a fixed amount of charge to the output node $n_{OUT}$ of ramp generator 200. Charge pump unit 210 includes an inverter 230, capacitors $C_{PUMP}$ and $C_{STORAGE}$, and switches SW1 and SW2. The power supply of inverter 230 along with the value $C_{PUMP}$ determine how much charge is added to $C_{STORAGE}$. (i.e., $\Delta Q = V_{DD\_BUFF} * C_{PUMP}$).

Ramp generator 200 according to one embodiment of the present invention generates a linear ramp in the following way. Output node $n_{OUT}$ is initialized to a desired starting value INITIAL_VALUE ($V_{INITIAL}$) by asserting the INITIALIZE signal to SW3, thus closing switch SW3. Since switch SW1 is initially open and SW2 is initially closed, capacitor $C_{STORAGE}$ is charged to $V_{starting}$.

When input signal IN goes high switch SW2 will open because a node n1 is low. Also, switch SW1 will close and capacitor $C_{PUMP}$ will be charged up by the voltage at node $n_{OUT}$ provided through analog buffer 220. Analog buffer 220 takes the voltage at node $n_{OUT}$, buffers that voltage so that there is no charge sharing between $n_{OUT}$ and a node $n_2$. Further, since capacitor $C_{PUMP}$ must be charged up to the value of $n_{OUT}$, analog buffer 220 is necessary to ensure that an equal amount of charge is added to $n_{OUT}$ at all times. Upon closing of the switch SW1, node $n_2$ will then be charged to the value of $n_{OUT}$.

When input signal IN goes low switch SW1 will open. Node n1 will rise to a value of $V_{DD\_BUFF}$, the voltage value from a power supply to ramp generator 200 or inverter 230. Inverter 230 may be any device with an adjustable or non-adjustable power supply. In one embodiment of the invention, inverter 230 is an inverter with an adjustable power supply, $V_{DD\_BUFF}$. By employing an adjustable power supply, the rate of ramp increase can be adjusted. When digital input signal IN goes low, SW2 will close and an amount of charge $\Delta Q = C_{PUMP} * V_{DD\_BUFF}$ will be added to node $n_{OUT}$. The voltage difference at $n_{OUT}$ is therefore $\Delta V = C_{PUMP} * V_{DD\_BUFF} / (C_{PUMP} + C_{STORAGE})$. Since a constant amount of charge is always being added to $n_{OUT}$, and $n_{OUT}$ has a constant capacitance contained in $C_{STORAGE}$, the voltage difference at $n_{OUT}$ will rise by a constant amount with each trailing edge of input signal IN. With each trailing edge of input signal IN, the potential at a node $n_3$ is higher than the potential at $n_{OUT}$. Consequently, charge is transferred from $n_3$ to $n_{OUT}$ and the voltage differential $\Delta V$ is added to the output.

For instance, on the first negative edge of digital input signal IN, the total voltage $V_{total}$ at $n_{OUT}$ is $V_{INITIAL} + \Delta V$. On the second negative edge of digital input signal IN, the total voltage $V_{TOTAL}$ at $n_{OUT}$ is $V_{INITIAL} + 2 * \Delta V$. The voltage differential $\Delta V$ is added to the output node in a linear increasing function of time consistent with a characteristic as shown in FIG. 1(b).

Since, the initial output voltage is $V_{INITIAL}$ then the ramp can be terminated with a final voltage $m*[C_{PUMP}*V_{DD\_BUFF} /(C_{PUMP}+C_{STORAGE})]+V_{INITIAL}$, where m is the number of edges of input signal IN from start to finish. Thus, the rate of ramp ($\Delta V$/clock edge) is proportional to the ratio $C_{PUMP}/C_{STORAGE}$ and also proportional to $V_{DD\_BUFF}$. The rate of ramp up may be set by using the ratio $C_{PUMP}/C_{STORAGE}$ and using $V_{DD\_BUFF}$ as an optional fine tune. $V_{DD\_BUFF}$ could be set to the high supply rail of the digital logic. If it is desirable to increment a digital counter on the negative edge of digital input signal IN, and reset that counter with the signal INITIALIZE, the digital signal will be proportional to the value from the ramp generator, and consequently the D/A necessary to make a single slope A/D converter. Thus, the clocking signal used to run the counter may also be used to generate the output of the ramp.

Figure 3:
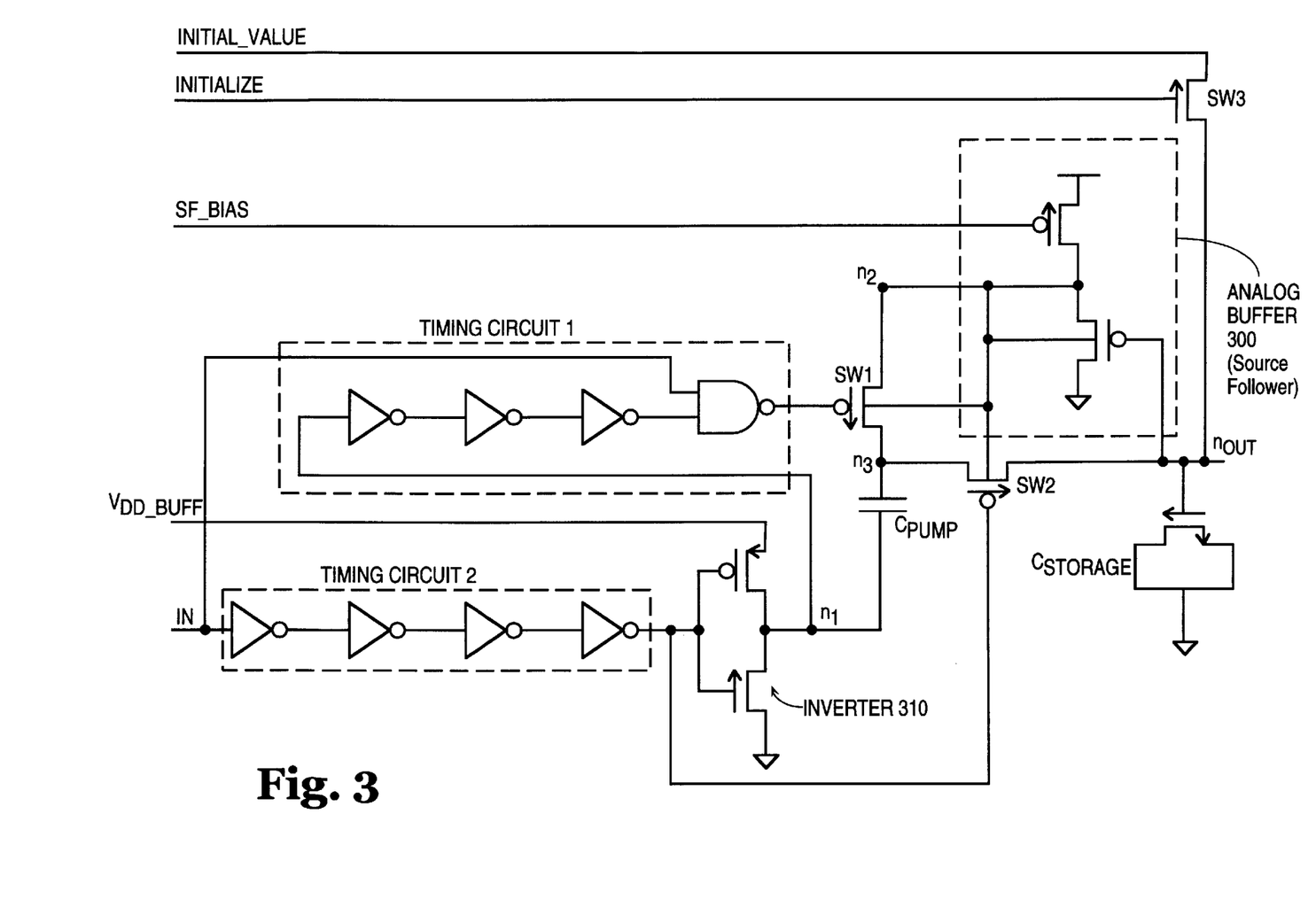
FIG. 3 illustrates a ramp generator according to another embodiment of the invention.

FIG. 3 illustrates a CMOS realization of the ramp generator described in connection with FIG. 2 in accordance with an embodiment of the present invention. The CMOS realization of the ramp generator uses an analog buffer 300. Analog buffers are well-known in the art and may include, for example, source followers or a full operational amplifier configured as a voltage follower. In this embodiment of the invention, analog buffer 300 has its input connected to $n_{OUT}$ and its output connected to $n_2$. Analog buffer takes the voltage value of $n_{OUT}$, buffers that value so that there is no charge sharing between $n_{OUT}$ and $n_2$. Analog buffer 300 ensures that a fixed and equal amount of charge is added to $n_{OUT}$ at each cycle. Analog buffer 300, according to one embodiment, is a p-device source follower, which is the simplest form of analog buffer with a linear relationship that can be built on a standard p-substrate CMOS process.

CMOS switches SW1 and SW2 are realized with p-devices. CMOS switch SW3 is realized with an n-device. SW3 allows $C_{STORAGE}$ to be charged to the initial value of the ramp. $C_{STORAGE}$ is implemented as an-MOS gate oxide type of capacitor so that it is area efficient. $C_{PUMP}$ could be implemented as a metal-metal type (or a gate oxide type capacitor) of capacitor so that a linear capacitor is ensured. FIG. 3 further shows an inverter 310 supplied by $V_{DD\_BUFFING}$.

FIG. 3 shows Timing Circuit 1 and Timing Circuit 2 having a plurality of inverter components. The inverters and the NAND gate of Timing Circuit 1 and Timing Circuit 2 may comprise any combination of devices such as inverters, buffers, and gates and are designed to ensure that the opening and closing of switches SW1, SW2, and SW3 do not overlap each other. The plurality of inverter components, in Timing Circuits 1 and 2 act to delay signal propagation so that the switching sequence is not corrupted. In one embodiment of the invention, Timing Circuit 1 contains three inverters and a NAND gate while Timing Circuit 2 contains four inverters. When input signal IN goes high, switch SW1 should close for capacitor $C_{PUMP}$ to be charged up to the value of $n_{OUT}$. If this is to occur, it is important that the potential at node n1 falls before switch SW1 closes. When IN is high, a high goes to one input of the NAND gate of Timing Circuit 1. A high also goes to the input of the set of four inverters of Timing Circuit 2. In one embodiment of the invention, inverter 310 is an inverter supplied by an adjustable power supply $V_{DD\_BUFF}$ to adjust the rate of increase of ramp output. At the output of the inverter 310, a low appears, after the delay through Timing Circuit 2, and causes n1 to fall and this low is sent also to the input of the set of 3 inverters comprising Timing Circuit 1. A high appears at the output of the three inverters and thus, at one input of the NAND gate. Thus, at the output of Timing Circuit 1, a low shows at the output of the NAND gate causing SW1 to close. Thus, Timing Circuit 1 delays SW1 from closing until after $n_1$ falls in potential.

When digital input signal IN goes low, switch SW1 must open prior to switch SW2 closing and node $n_1$ rising. If switch SW is not opened when switch SW2 closes, and node $n_1$ rises, some charge or current may flow back to node $n_2$ through switch SW1. This current flow may adversely affect the amount of charge that is added to the output and the ramp output may not be obtained. For n1 to rise to a value of $V_{DD\_BUFF}$, it is important that SW1 opens before n1 rises. When IN is low, a low goes to one input of the NAND gate of Timing Circuit 1. A high then shows at the output of the NAND gate (and the output of the Timing Circuit 1) effectively opening SW1 regardless of the signal at the other input of the NAND gate. To ensure that SW1 opens before n1 rises, the low from the digital input signal IN goes to the input of the set of four inverters of Timing Circuit 2. A low appears at the output of Timing Circuit 2. A high appears at the output of inverter 310 causing node n1 to rise after SW1 opens. This implementation also allows SW2 to open before n1 falls so that the charge will be transferred to $C_{STORAGE}$ and node $n_3$ will not go too high as to stress any devices or junctions. The operation of the CMOS ramp generator, including the use of the signals IN, $V_{DD\_BUFF}$, INITIAL_VALUE and INITIALIZE, are similar to that described for FIG. 2 and will not be repeated. An analog buffer 300 is shown in FIG. 3 configured as a source follower with a bias SF-BIAS, but may be implemented as any type of operational amplifier or buffer.

Figure 4:
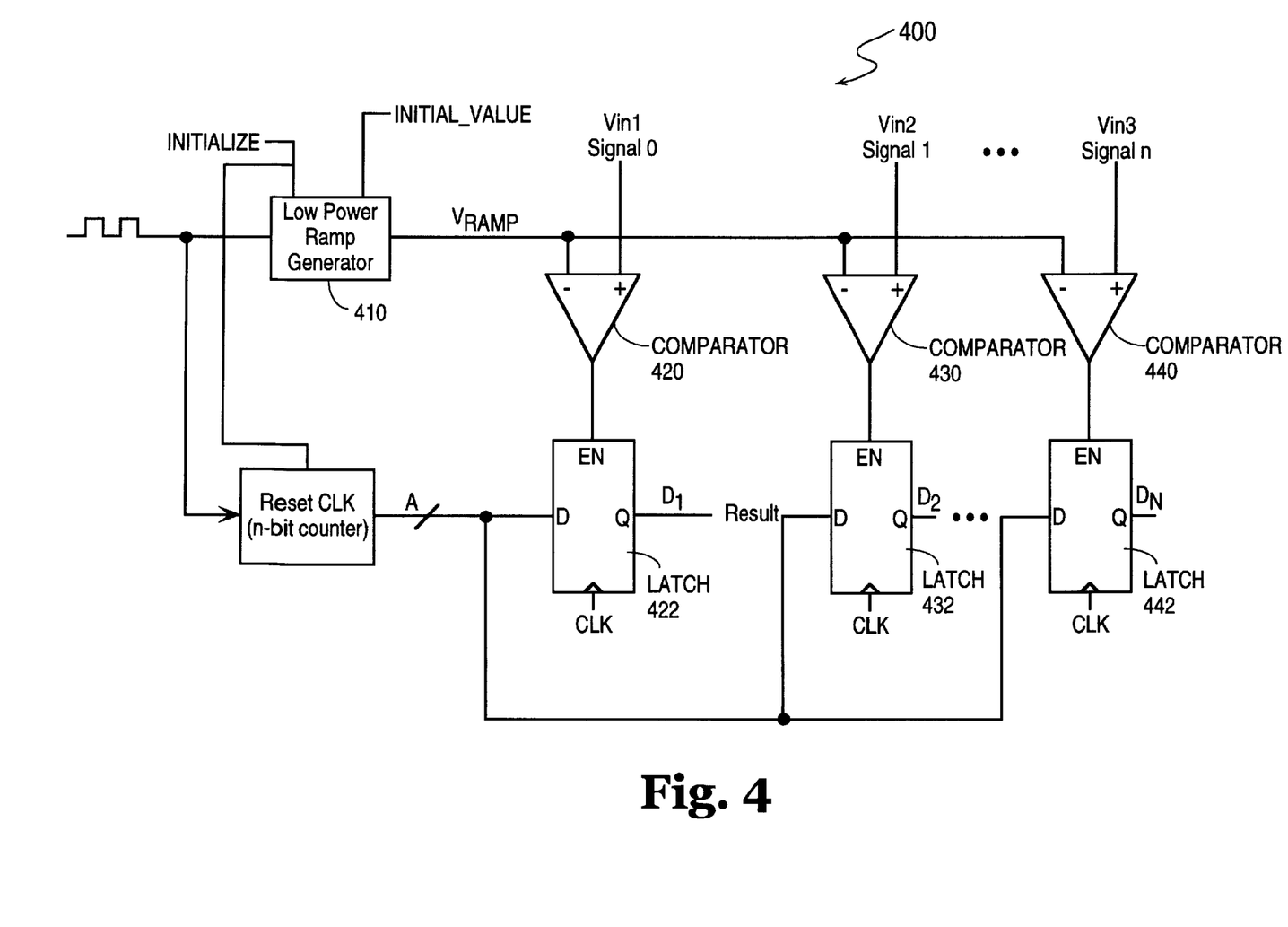
FIG. 4 illustrates the use of the low power ramp generator in a single-slope parallel A/D converter according to one embodiment of the invention.

FIG. 4 illustrates the use of the low power ramp generator in a single-slope parallel A/D converter according to one embodiment of the invention. FIG. 4 shows that single-slope A/D converter 400 consists of a low power ramp generator 410, a plurality of comparators 420, 430, 440 and a plurality of latches 422, 432, and 442. Comparators 420, 430, and 440 are coupled to the enable (EN) of latches 422, 432, and 442, respectively. At the beginning of a conversion cycle, the analog signals Vin1, Vin2, and Vin3 are sampled, held and applied to the positive terminals of the comparators 420, 430, and 440.

For ease of understanding, the operation of A/D converter 400 will be discussed in connection with signal Vin1 only. The n-bit counter is reset to all zeroes during the same clock cycle(s) in which the ramp generator output is initialized to INITIAL_VALUE through the assertion of the INITIALIZE signal. the initial value should be assured to be a lower voltage than the signal Vin1, (or any of the signals being converted). With the ramp value lower than Vin1, the output of the comparator will be high, so that latches of the A/D will latch the all zeroes value presently being output from the n-bit counter. With each trailing (and/or leading) edge of the clock signal the n-bit incrementor will increment, and the voltage value present at the output of the ramp generator will increase by a constant but small amount. As long as the voltage value of the ramp is below the value of signal Vin1 the n-latches associated with Vin1 will continue to latch the value present at the output of the n-bit counter. Eventually the voltage value of the ramp generator output will exceed that of Vin1, and the comparator will output a low signal.

Since this is coupled to the enable of the latches, the latches will not latch this new value of the n-bit counter. Thus, at the end of the conversion, the latches will contain the last n-bit value that corresponded to a voltage value at the output of the ramp generator that was less than Vin1. Through this conversion, the analog signals, signal 0, signal 1, ..., signal n may be converted to their respective digital word formats in a parallel fashion.

Figure 5:
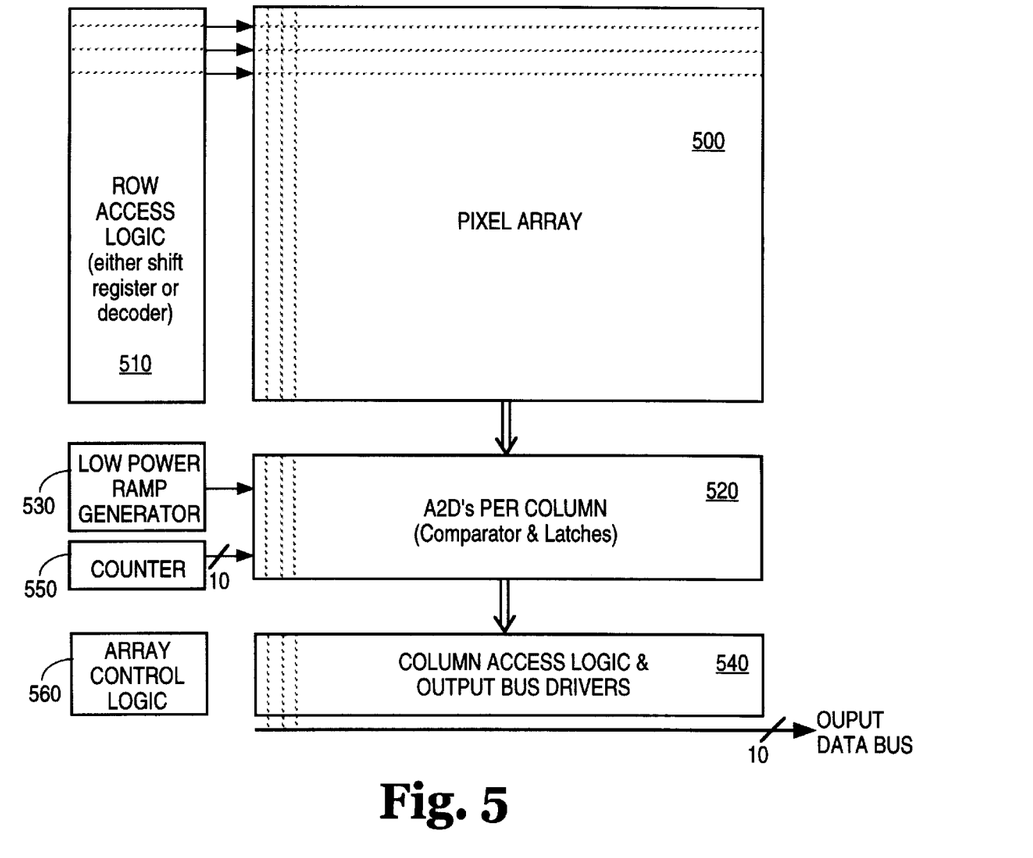
FIG. 5 illustrates the use of a low power ramp in an imaging device, according to one embodiment of the invention.

FIG. 5 illustrates the use of a low power ramp generator in an imaging device, according to one embodiment of the invention. The imaging device includes a pixel array 500, row access logic unit 510, A/D converters 520, low power ramp generator 530, column access logic and output bus drivers 540, counter 550, and array control logic unit (ACL) 560. The imaging device converts an imaged scene from the optical image in the following way. The analog data stored in the columns of pixel array 500 (which represents the image) are sent to A/D converters 520 (one for each column). The analog data is converted to a digital value which is stored in the latches (not shown) of A/D converters 520. The analog data is then driven onto an output bus 10 when accessed on a column by column basis.

In one embodiment of the invention, each of A/D converters 520 contains a comparator (not shown) and a 10-bit latch (not shown). The comparator compares the analog value from the pixel array 500 to the analog value of low power ramp generator 530. Counter 550 drives a 10-bit digital value across A/D converters 520 which is proportional to the analog value that low power ramp generator 530 is providing. This count value from counter 550 is latched by the latches within each of the A/D converters 520 when the value of low power ramp generator 530 is lower than the value coming from the column of pixel array 500. Once the value of low power ramp generator 530 exceeds the value(s) from pixel array 500, the latches will no longer latch the count value. Thus, when the conversion is complete the latches in each of the A/D converters 520 will contain the last value of counter 550 which corresponded to a ramp value(s) less than the value of the column from pixel array 500, and consequently the digital representation of the value(s) in pixel array 500. In this example, advantageously, a single low power ramp generator and counter are capable of converting in parallel any number of analog values provided that a comparator and latch pair or the equivalent is also provided for each. ACL 560 is a complex state machine that coordinates all the activities involved in the operation of the array. It controls the row access logic and the column access logic. The column access logic is usually done as a serial shift out of the data contained in the A/D latches.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. An apparatus comprising:

a charge pump configured to receive an input timing signal having a timing edge and to provide, at an output, a voltage that increments by a fixed amount of voltage for each timing edge of said input timing signal, said charge pump having a storage capacitive element coupled to said output and a pump capacitive element; and a buffer coupled to said output of said charge pump, said buffer feeding back a second voltage based on the voltage at said output to said pump capacitive element of said charge pump without transferring charge from said storage capacitive element to said pump capacitive element.

2. An apparatus according to claim 1 further comprising an initialization circuit coupled to said output of said charge pump, said initialization circuit providing a starting value at said output of said charge pump.

3. An apparatus according to claim 1 wherein said charge pump comprises:

an inverter configured to invert said input timing signal; and wherein said pump capacitive element is coupled to the output of said inverter at a terminal opposite said buffer.

4. An apparatus according to claim 1 wherein said charge pump comprises:

a first switch configured to receive said input timing signal, and upon a signal therefrom, to close to couple said pump capacitive element with said buffer.

5. An apparatus according to claim 4 wherein said charge pump comprises:

a second switch configured to receive said output of said inverter, and upon a signal therefrom, to close to couple said pump capacitive element to said output of said charge pump, transferring said fixed amount of voltage to said output of said charge pump, said first switch being open when said second switch is closed.

6. An apparatus according to claim 1 wherein said storage capacitive element is configured to provide a repository for charge.

7. An apparatus according to claim 3 wherein said charge pump includes a supply voltage coupled to said inverter, wherein said inverter is configured to provide said supply voltage to said opposite terminal of said pump capacitive element in response to said input timing signal, and wherein said supply voltage is configured to adjust said fixed amount of voltage.

8. An apparatus according to claim 5 wherein said first and second switches are MOS devices.

9. An apparatus according to claim 1 wherein said buffer is an analog buffer and includes a source follower.

10. An apparatus according to claim 8 wherein said charge pump includes a first timing circuit configured to delay said input timing signal to said first switch.

11. An apparatus according to claim 10 wherein said charge pump includes a second timing circuit configured to delay said input timing signal to said second switch and to said inverter circuit, said first and second timing circuits ensuring that complete charge transfer occurs across said second switch.

12. An analog to digital converter comprising: a ramp signal generator that includes:

a charge pump configured to receive an input timing signal having a timing edge and to provide, at an output, a voltage that increments by a fixed amount of voltage for each timing edge of said input timing signal, said charge pump having a storage capacitive element coupled to said output and a pump capacitive element; and a buffer coupled to said output of said charge pump, said buffer feeding back a second voltage based on the voltage at said output to said pump capacitive element of said charge pump without transferring charge from said storage capacitive element to said pump capacitive element.

a comparator and corresponding latch for each analog input signal requiring conversion, said each analog input signal being coupled to a terminal of its corresponding comparator, said output of said ramp signal generator being coupled to another terminal of each comparator; and a counter having an output that produces an incrementing value, said output being coupled to said ramp signal generator configured to cause said ramp signal generator to increment said voltage of said ramp signal generator output upon every incrementing of said counter, said output of said counter also being coupled to an input of each latch, said latch outputting said counter value being input when its said corresponding comparator returns a signal.

13. An apparatus according to claim 1 wherein said timing edge is a trailing edge.

14. An analog to digital converter according to claim 12 wherein said analog input signal is imaging sensor array photo detector voltage signals.

15. An apparatus according to claim 1 wherein said second voltage is selected so as to equalize the charge between said storage capacitive element and said pump capacitive element.

16. An apparatus according to claim 1 further comprising at least one switch for alternately coupling said storage capacitive element directly to said pump capacitive element and coupling said storage capacitive element to said pump capacitive element through said buffer.

17. An apparatus according to claim 2 wherein said pump capacitive element has two opposing terminals and wherein said initialization circuit comprises a switch to couple said opposing terminals to each other and to a terminal of said storage capacitive element.

18. An analog to digital converter according to claim 12 wherein said second voltage is selected so as to equalize the charge between said storage capacitive element and said pump capacitive element.

19. An analog to digital converter according to claim 12 further comprising at least one switch for alternately coupling said storage capacitive element directly to said pump capacitive element and coupling said storage capacitive element to said pump capacitive element through said buffer.

20. An analog to digital converter according to claim 19 wherein said pump capacitive element has two opposing terminals and wherein said initialization circuit comprises a switch to couple said opposing terminals to each other and to a terminal of said storage capacitive element.

21. An analog to digital converter according to claim 12 further comprising an initialization circuit coupled to said output of said charge pump, said initialization circuit providing a starting value at said output of said charge pump and said counter.

22. An analog to digital converter according to claim 12 wherein said charge pump further comprises an inverter configured to invert said input timing signal, and wherein said pump capacitive element is coupled to the output of said inverter at a terminal opposite said buffer.

23. An analog to digital converter according to claim 22 wherein said charge pump comprises a first switch configured to receive said input timing signal, and upon a signal therefrom, to close to couple said pump capacitive element with said buffer.

24. An analog to digital converter according to claim 23 wherein said charge pump further comprises a second switch configured to receive said output of said inverter, and upon a signal therefrom, to close to couple said pump capacitive element to said output of said charge pump, transferring said fixed amount of voltage to said output of said charge pump, said first switch being open when said second switch is closed.

25. An analog to digital converter according to claim 22 wherein said charge pump includes a supply voltage coupled to said inverter, wherein said inverter is configured to provide said supply voltage to said opposite terminal of said pump capacitive element in response to said input timing signal, and wherein said supply voltage is configured to adjust said fixed amount of voltage.

26. An analog to digital converter according to claim 12 wherein said buffer is an analog buffer and includes a source follower.

27. An analog to digital converter according to claim 24 wherein said charge pump includes a first timing circuit configured to delay said input timing signal to said first switch.

28. An analog to digital converter according to claim 27 wherein said charge pump includes a second timing circuit configured to delay said input timing signal to said second switch and to said inverter circuit, said first and second timing circuits ensuring that complete charge transfer occurs across said second switch.

29. A method comprising:
   receiving in a charge pump an input timing signal having a timing edge;
   providing, at an output of said charge pump, a voltage that increments by a fixed amount for each timing edge of said input timing signal;
   based on the voltage at said output of said charge pump, feeding back a second voltage through a buffer to a pump capacitive element of said charge pump without transferring charge from a storage capacitive element to said pump capacitive element, said storage capacitive element being coupled to said output and to said pump capacitive element.

30. A method according to claim 29 wherein said second voltage is selected so as to equalize the charge between said storage capacitive element and said pump capacitive element.

31. A method according to claim 29 further comprising alternately coupling said storage capacitive element directly to said pump capacitive element and coupling said storage capacitive element to said pump capacitive element through said buffer.

32. A method according to claim 31 wherein said pump capacitive element has two opposing terminals and wherein said initialization circuit comprises a switch to couple said opposing terminals to each other and to a terminal of said storage capacitive element.

33. A method according to claim 29 further comprising an initialization circuit coupled to said output of said charge pump, said initialization circuit providing a starting value at said output of said charge pump.

34. A method according to claim 29 further comprising receiving said input timing signal at a first switch and, upon a signal therefrom, closing said first switch to couple said pump capacitive element with said buffer.

35. A method according to claim 34 further comprising receiving said input timing signal at a second switch, and upon a signal therefrom, closing said second switch to couple said pump capacitive element to said output of said charge pump, transferring said fixed amount of voltage to said output of said charge pump, said first switch being open when said second switch is closed.

36. A method according to claim 29 further comprising providing a supply voltage to a terminal of said pump capacitive element in response to said input timing signal to adjust said fixed amount of voltage.

37. A method according to claim 34 further comprising delaying said input timing signal to said first switch.

38. A method according to claim 37 further comprising delaying said input timing signal to said second switch and ensuring that complete charge transfer occurs across said second switch.

* * * * *

UNITED STATES PATENT AND TRADEMARK OFFICE
CERTIFICATE OF CORRECTION

PATENT NO.   : 6,144,330
DATED        : November 7, 2000
INVENTOR(S)  : Hoffman et al.

It is certified that error appears in the above-identified patent and that said Letters Patent is hereby corrected as shown below:

Column 4,
Line 47, delete "$V_{DD\_BUFFING}$", insert -- $V_{DD\_BUFF}$ --.

Signed and Sealed this

Twenty-ninth Day of October, 2002

Attest:

Attesting Officer

JAMES E. ROGAN
Director of the United States Patent and Trademark Office